US007177159B2

(12) United States Patent
Wang et al.

(10) Patent No.: US 7,177,159 B2
(45) Date of Patent: Feb. 13, 2007

(54) PACKAGING STRUCTURE OF ELECTRONIC CARD (75) Inventors: Hank Wang, Hsin Chu (TW); Hung Tse Wang, Hsin Chu (TW)

(73) Assignee: 3 View Technology Co., Ltd., Hsin Chu (TW)

( * ) Notice: Subject to any disclaimer, the term of this patent is extended or adjusted under 35 U.S.C. 154(b) by 0 days.

(21) Appl. No.: 11/094,175

(22) Filed: Mar. 31, 2005

(65) Prior Publication Data
US 2005/0243532 A1   Nov. 3, 2005

(30) Foreign Application Priority Data
May 3, 2004   (TW) ................ 93112415 A
May 3, 2004   (TW) ................ 93206854 U
May 13, 2004  (TW) ................ 93207471 U
Sep. 16, 2004 (TW) ................ 93214833 U (51) Int. Cl.
    *H05K 7/18*   (2006.01)
    *H05K 1/00*   (2006.01)
(52) U.S. Cl. .................... 361/797; 439/76.1
(58) Field of Classification Search ........ 361/737, 361/686, 733, 736, 752, 753; 439/76.1, 638, 439/945, 946
See application file for complete search history.

(56) References Cited

U.S. PATENT DOCUMENTS

| 4,695,925 | A  | * | 9/1987  | Kodai et al. ............... 361/737 |
| 5,581,127 | A  | * | 12/1996 | Shinohara ................. 257/679 |
| 5,612,532 | A  | * | 3/1997  | Iwasaki .................... 235/492 |
| 5,877,488 | A  | * | 3/1999  | Klatt et al. ............... 235/486 |
| 5,888,874 | A  | * | 3/1999  | Manning ................... 438/309 |
| 6,109,939 | A  | * | 8/2000  | Kondo et al. .............. 439/140 |
| 6,134,114 | A  | * | 10/2000 | Ungermann et al. ....... 361/737 |
| 6,276,944 | B1 | * | 8/2001  | Klatt ...................... 439/76.1 |
| 6,877,995 | B1 | * | 4/2005  | Chen ...................... 439/76.1 |

* cited by examiner

*Primary Examiner*—Kamand Cuneo
*Assistant Examiner*—Hung Nguyen
(74) *Attorney, Agent, or Firm*—Bacon & Thomas, PLLC (57) ABSTRACT A packaging structure of an electronic card includes a metal cover, a plastic frame and a printed circuit board. The metal cover is produced by providing a metal plate having a central portion and an edge portion and performing a draft operation on the metal plate such that the edge portion is vertical to the central portion. The plastic frame has a first surface combined with the metal cover. The printed circuit board is combined with a second surface of the plastic frame.

15 Claims, 14 Drawing Sheets

PACKAGING STRUCTURE OF ELECTRONIC CARD

FIELD OF THE INVENTION

The present invention relates to an electronic card, and more particularly to a packaging structure of a small-sized electronic card.

BACKGROUND OF THE INVENTION

Electronic cards such as modem cards, Local Area Network cards (LAN cards) and memory cards are widely used and developed toward minimization. The common standard specifications of electronic cards comprise for example PCMCIA cards, Compact Flash cards (CF cards), Secure Digital memory cards (SD cards), etc. In addition, some new standard specifications are still in development. The contents associated with these specifications are somewhat different. However, the packaging structures of these electronic cards are basically identical. Such packaging structure comprises a metal cover for encapsulating a printed circuit board (PCB). The external surface of the case should be electrically conductive and comprises a ground terminal. After an electronic card is inserted into a slot of an electronic device, the ground terminal will be electrically connected to the system reference of the electronic device for grounding.

The packaging structure of the electronic card needs to provide sufficient mechanical strength and electrical properties, which should meet certain standards requirements. Moreover, it is necessary to produce these electronic cards on a large scale and with low cost. According to the conventional packaging process, top and bottom metal covers with a plurality of bent pieces on the edge thereof are firstly provided. Then, these bent pieces are coupled with a plastic frame. Then, the top and bottom metal covers are riveted by clamp/jig tools. Afterward, the printed circuit board and the plastic frame are encapsulated. As known, the bent pieces fail to be tightly coupled with the plastic frame and the mechanical strengths for the top metal cover and the bottom metal cover are insufficient. Therefore, the metal covers are easily loosened or fallen off when an external force or a deflection force is exerted. Moreover, the packaging structure formed by means of riveting has poor mechanical strength, and thus results in deformation of the metal cover.

Other processes for assembling an electronic card are developed. However, such processes usually use the metal covers with bent pieces on the edges thereof. When an external force or a deflection force is exerted on the electronic card, the bonding regions between the plastic frame and the metal cover are readily separated due to the insufficient force. These processes have been described, for example, in U.S. Pat. Nos. 5,379,587, 5,475,919 and 5,490,891, and Taiwanese Patent Nos. 577624, 111188, 489590 and 549688.

SUMMARY OF THE INVENTION

It is an object of the present invention to provide a packaging structure of an electronic card having enhanced adhesion between the plastic frame and the metal cover.

In accordance with a first aspect of the present invention, there is provided a packaging structure of an electronic card. The packaging structure comprises a metal cover, a plastic frame and a printed circuit board. The metal cover is produced by providing a metal plate having a central portion and an edge portion and performing a draft operation on the metal plate such that the edge portion is vertical to the central portion. The plastic frame has a first surface combined with the metal cover. The printed circuit board is combined with a second surface of the plastic frame.

In an embodiment, the packaging structure further comprises at least a bonding region in the edge portion so as to facilitate the bonding effect when the metal cover is combined with the plastic frame.

In an embodiment, the bonding region includes a plurality of holes previously formed in the edge portion.

In an embodiment, the bonding region further comprises a vacant portion along a diagonal line between a first corner of the central portion and a second corner of the edge portion and distant from the first corner by a distance.

In an embodiment, the bonding region further comprises a cutting line adjacent to the first corner of the central portion.

In an embodiment, the first surface of the plastic frame is combined with the metal cover by a first embedding operation. For example, the first embedding operation comprises an insert molding operation, a fastening operation, an ultrasonic welding operation or a high frequency welding operation.

In an embodiment, the second surface of the plastic frame is combined with the printed circuit board by a second embedding operation. For example, the second embedding operation comprises an insert molding operation, a fastening operation, an ultrasonic welding operation or a high frequency welding operation.

In an embodiment, the metal cover further comprises a recess on an external surface thereof for facilitating removing the packaging structure.

In an embodiment, the printed circuit board further comprises first and second contact pads, and the plastic frame further comprises first and second openings corresponding the first and second contact pads.

In an embodiment, the packaging structure further comprises a ground element having first and second ends penetrating the first and second openings to be coupled with the first and second contact pads of the printed circuit board, and an upper portion electrically connected to an inner surface of the metal cover so as to form an electrostatic discharging path from the printed circuit board, the ground element and the metal cover.

In an embodiment, the ground element is a metallic resilience sheet.

Preferably, the electronic card is a secure digital card (SD card), a multimedia memory card (MMC card), a portable disc, an intelligent memory card, a modem card, a Local Area Network card (LAN card) or a memory card.

In accordance with a second aspect of the present invention, there is provided a packaging structure of an electronic card. The packaging structure comprises a metal cover, a plastic frame, at least a bonding region, a printed circuit board and a ground element. The metal cover is produced by providing a metal plate having a central portion and an edge portion and performing a draft operation on the metal plate such that the edge portion is vertical to the central portion. The plastic frame has a first surface combined with the metal cover. The bonding region is used to facilitate the bonding effect when the metal cover is combined with the plastic frame. The printed circuit board is combined with a second surface of the plastic frame. The ground element is electrically connected with the metal cover and the printed circuit board.

In an embodiment, the printed circuit board comprises first and second contact pads, the plastic frame comprises first and second openings corresponding the first and second contact pads, and the ground element has first and second ends penetrating the first and second openings to be coupled with the first and second contact pads and an upper portion electrically connected to an inner surface of the metal cover so as to form an electrostatic discharging path from the printed circuit board, the ground element and the metal cover.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The packaging structure of the present invention can be applied to small-sized electronic cards such as secure digital cards (SD cards) or multimedia memory cards (MMC cards). Furthermore, the packaging structure of the present invention is also suitable for packaging other customarily used electronic cards such as portable discs, intelligent memory cards, modem cards, Local Area Network cards (LAN cards) or memory cards.

The packaging structure of an electronic card according to a preferred embodiment of the present invention will be illustrated as follows.

Figure 1A:
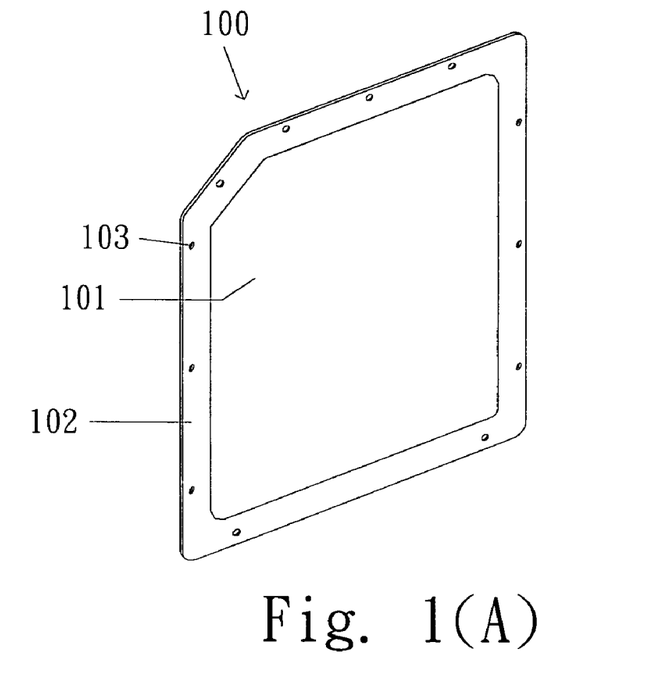
FIGS. 1(A) and 1(B) are schematic views illustrating a process for fabricating a three-dimensional metal cover used in an electronic card according to a first embodiment of the present invention.
Figure 1B:
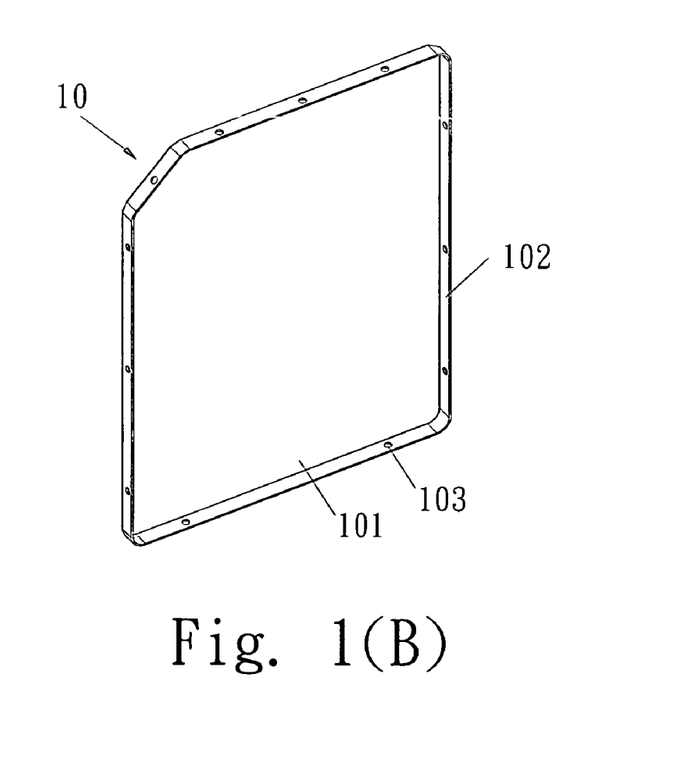

Firstly, as shown in FIG. 1(A), a metal plate 100 having a central portion 101 and an edge portion 102 is provided. Then, a draft operation is performed such that the central portion 101 of the metal plate 100 is raised upwardly and the edge portion 102 is vertical to the central portion 101. Afterward, a three-dimensional metal cover 10 as shown in FIG. 1(B) is formed. By the way, the edge portion 102 has a plurality of holes 103 to be used as bonding regions of the metal cover 10.

Figure 2A:
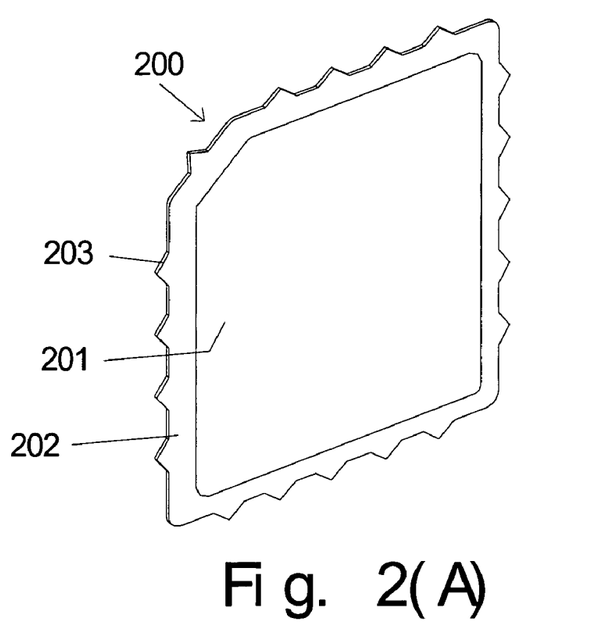
FIGS. 2(A) and 2(B) are schematic views illustrating a process for fabricating a three-dimensional metal cover used in an electronic card according to a second embodiment of the present invention.
Figure 2B:
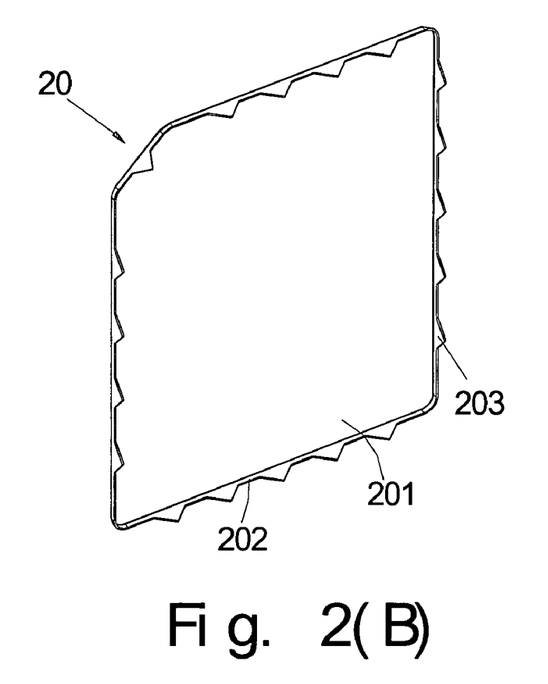

Alternatively, the bonding regions of the metal cover can have another proper structure. As shown in FIG. 2(A), a metal plate 200 having a central portion 201 and an edge portion 202 is provided. The edge portion 202 has a plurality of saw-toothed structures 203 to be used as bonding regions. After a draft operation is performed, the central portion 201 of the metal plate 200 is raised upwardly and the edge portion 202 is vertical to the central portion 201. Afterward, a three-dimensional metal cover 20 as shown in FIG. 2(B) is formed.

Figure 3:
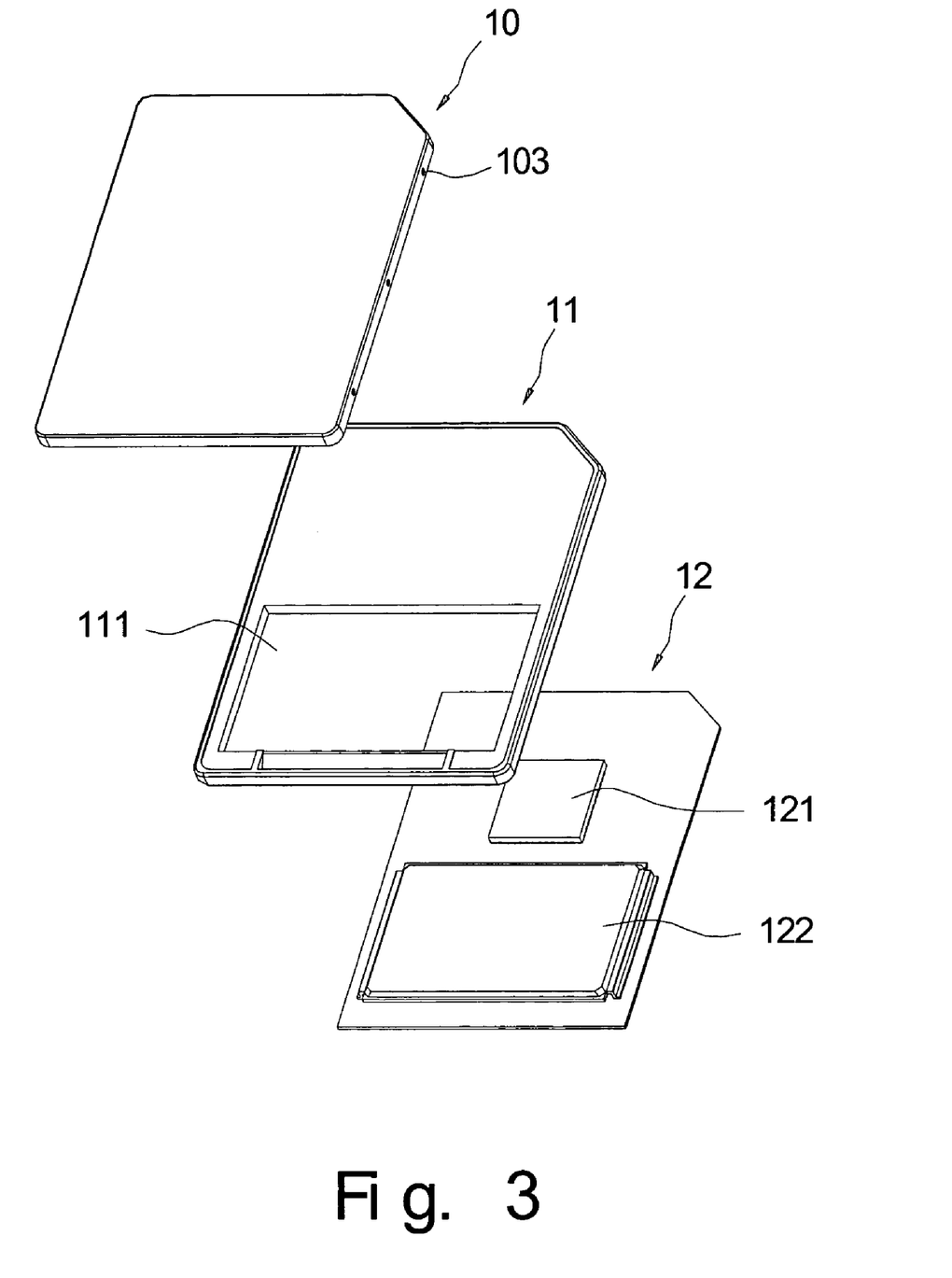
FIG. 3 is an exploded view illustrating a packaging structure of an electronic card according to a preferred embodiment of the present invention.

Please refer to FIG. 3, which illustrates an exploded view of a packaging structure of an electronic card. The packaging structure comprises the metal cover 10 as shown in FIG. 1(B), a plastic frame 11 and a printed circuit board 12. The plastic frame 11 is combined with the metal cover 10 by using a conventional embedding technology such as an insert molding operation, a fastening operation, an ultrasonic welding operation or a high frequency welding operation. For example, the molten plastic material of the plastic frame 11 will penetrate through the holes 103 of the metal cover 10, and after being cooled, the metal cover 10 is coupled with the plastic frame 11. Since the holes 103 of the metal cover 10 are used as bonding regions with the plastic frame 11, the metal cover 10 can be tightly adhered on the plastic frame 11. On the other hand, since the metal cover 10 of the present invention is formed from the draft operation on the metal plate 100, it has stronger force to resist deformation when compared with the conventional metal cover with bent pieces.

Several electronic components 121 and a memory 122 are mounted on the printed circuit board 12. The plastic frame 11 has a receptacle 111 for accommodating the memory 122 of the printed circuit board 12. Similarly, the printed circuit board 12 is combined with the plastic frame 11 by using a conventional embedding technology such as an insert molding operation, a fastening operation, an ultrasonic welding operation or a high frequency welding operation. In such way, the printed circuit board 12 is also tightly adhered onto the plastic frame 11. The rear surface of the printed circuit board 12 can be directly used as another cover opposed to the metal cover 10, thereby saving the overall cost of the electronic card.

As known, for any electronic product, the space for accommodating the electronic card is very small and thus it is difficult to withdraw the electronic card out of the electronic product. For facilitating withdrawing the electronic card out of the electronic product, a recess 104 can be optionally provided on the metal cover 10 of the electronic card. The user can place his finger in the recess 104 and then pull out the electronic card. The process for forming the recess 104 can be performed at the moment when the metal cover 10 is formed. Alternatively, the recess 104 may be formed after the metal cover 10 is formed. Likewise, another similar recess can be provided on the external surface of the printed circuit board 12.

Figure 5:
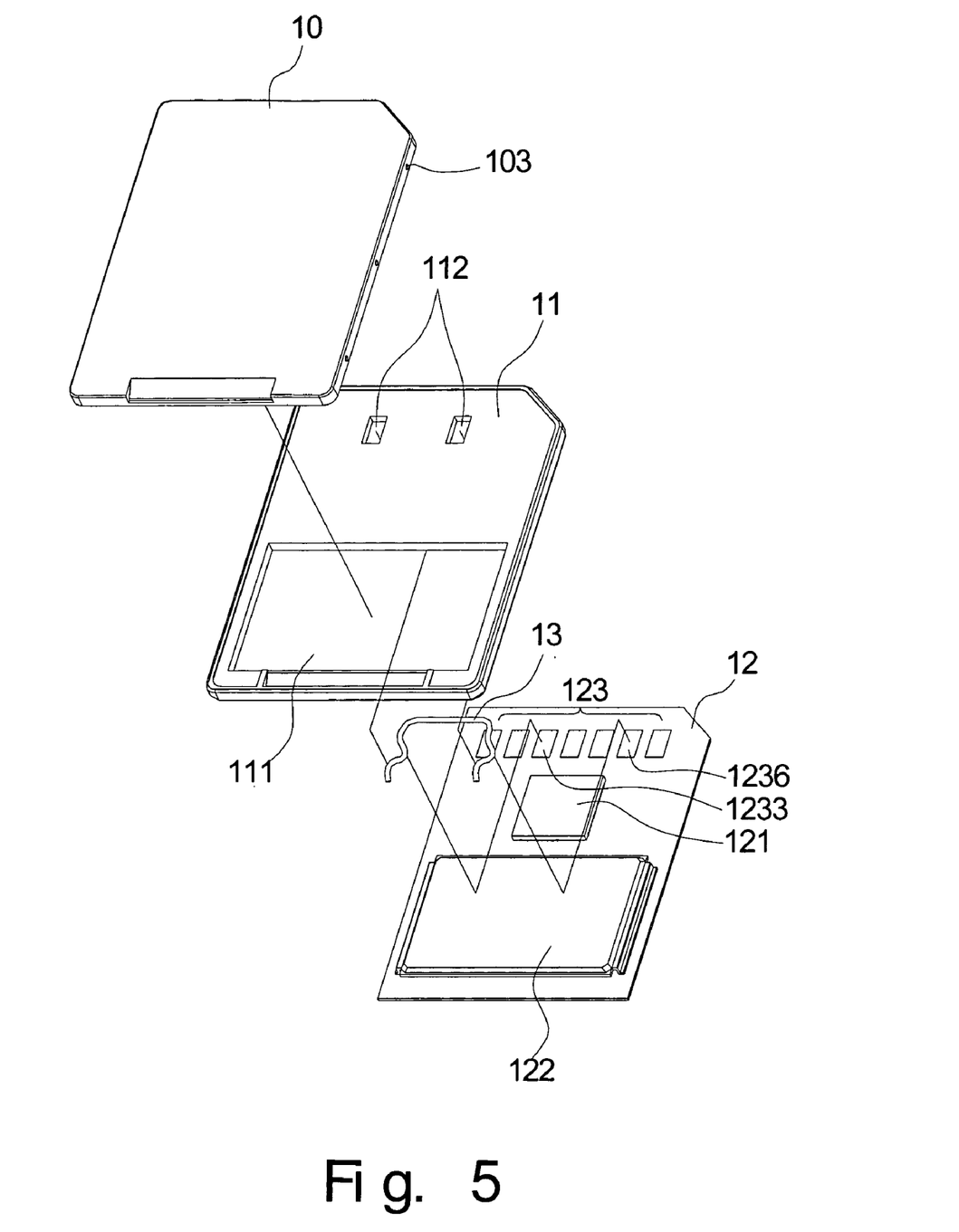
FIG. 5 is an exploded view illustrating a packaging structure of an electronic card having a ground element.

A further embodiment of an electronic card is illustrated in FIG. 5. In this embodiment, the metal cover 10, the plastic frame 11 and the printed circuit board 12 included therein are similar to those shown in FIG. 3, and are not to be redundantly described herein. In addition, a ground element 13 is further included in the electronic card, the plastic frame 11 further comprises two openings 112, and the printed circuit board 12 further comprises several contact pads 123. Two of these contact pads 1233 and 1236 are electrically connected to the grounding circuit (not shown) in the printed circuit board 12 to act as ground pads. The ground element 13 is preferably a metallic resilience sheet. The upper portion of the ground element 13 is substantially parallel with the inner surface of the metal cover 10 and electrically connected to the metal cover 10. Two ends of the ground element 13 penetrate through the openings 112 and are coupled to the contact pads 1233 and 1236, respectively. In such way, the electricity generated from the electronic card will pass through the discharging path formed by the contact pads 1233 and 1236 of the printed circuit board 12, the ground element 13 and the metal cover 10 so as to achieve electrostatic discharge (ESD) protection.

Figure 4:
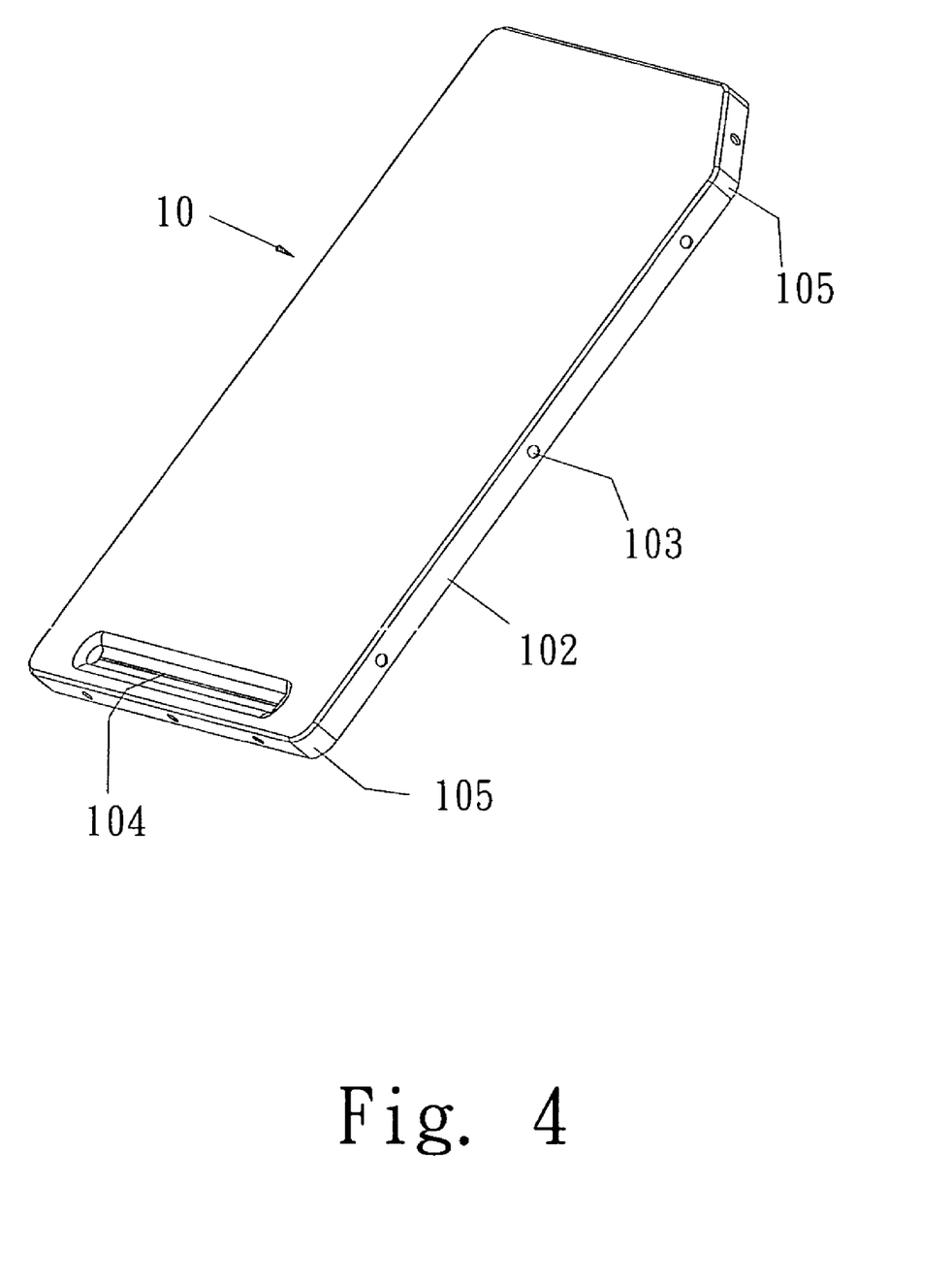
FIG. 4 is a perspective view illustrating another metal cover used in the present invention.

As previously described, the metal cover 10 formed by the draft operation can offer a strong force to resist deformation when compared with the prior art. Depending on expansibility, thickness and material of the metal cover 10, the effect for resisting deformation may be somewhat impaired. For example, if a large draft operation is done, some cracks may be generated on the corner portions 105 of the edge portion 102 (as shown in FIG. 4) due to the resultant force of the tensile and compressive forces. In addition, if the cracking degree is very large, the embedding technology such as an insert molding operation fails to tightly combine the metal cover 10 with the plastic frame 11. The cracking degree is more serious in a case that the thickness of the metal cover 10 is less than 0.06 mm.

Figure 6A:
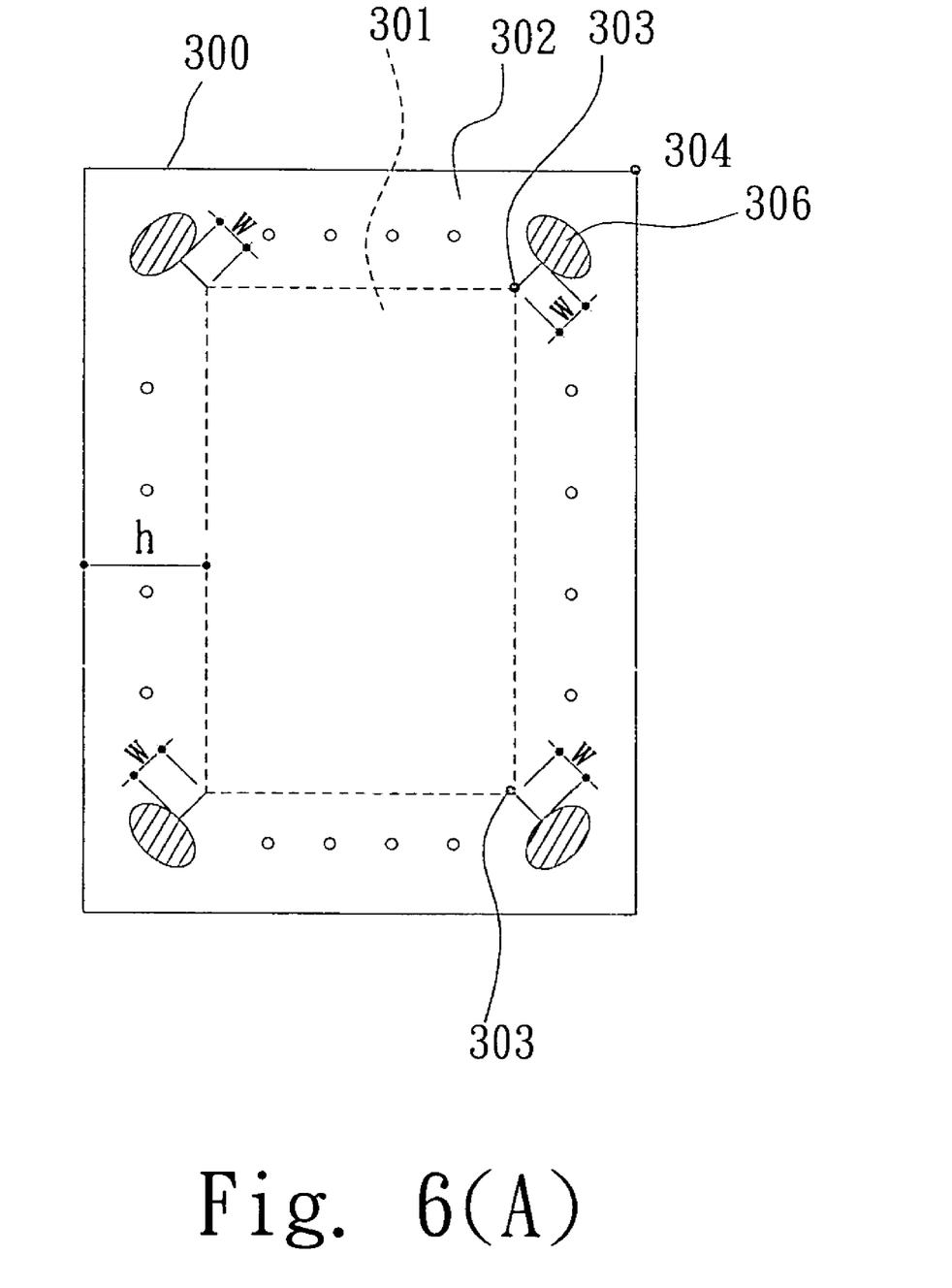
FIGS. 6(A) and 6(B) are schematic views illustrating a process for fabricating a three-dimensional metal cover used in an electronic card according to a third embodiment of the present invention.
Figure 6B:
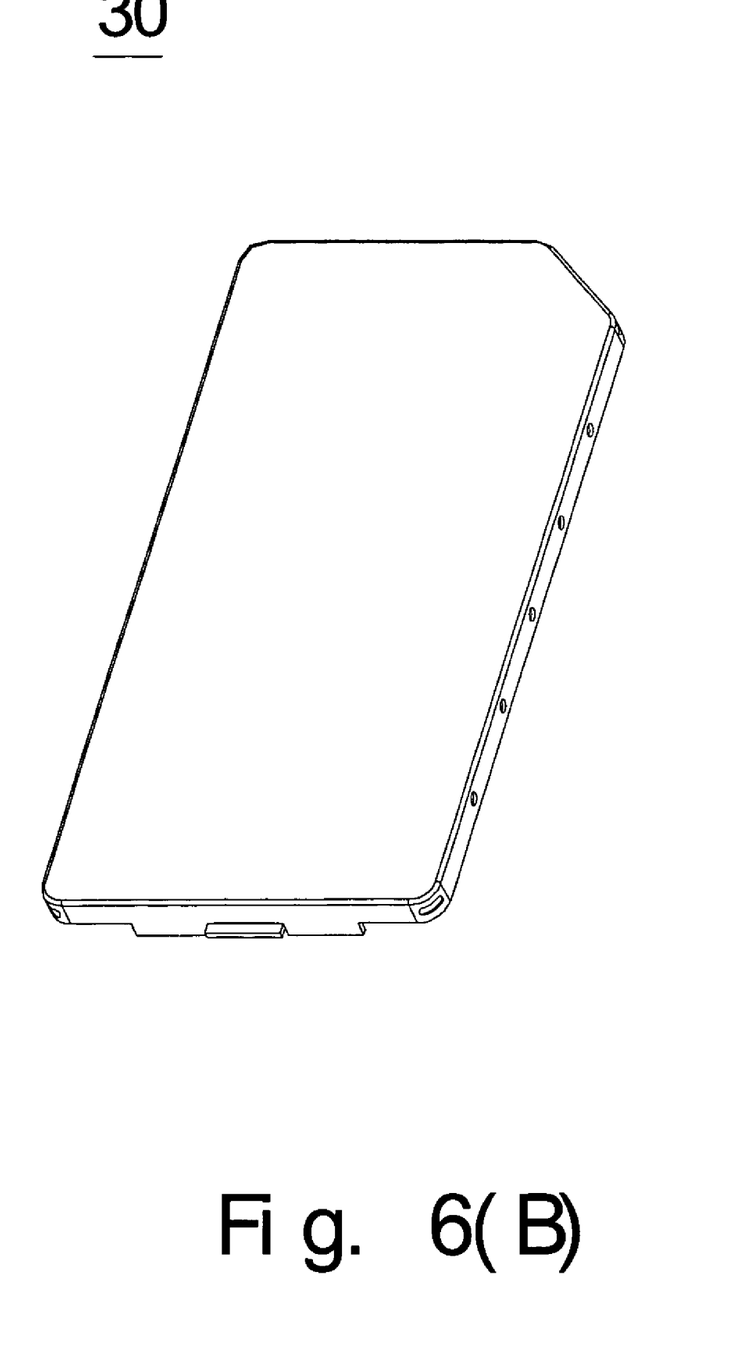
Figure 6C:
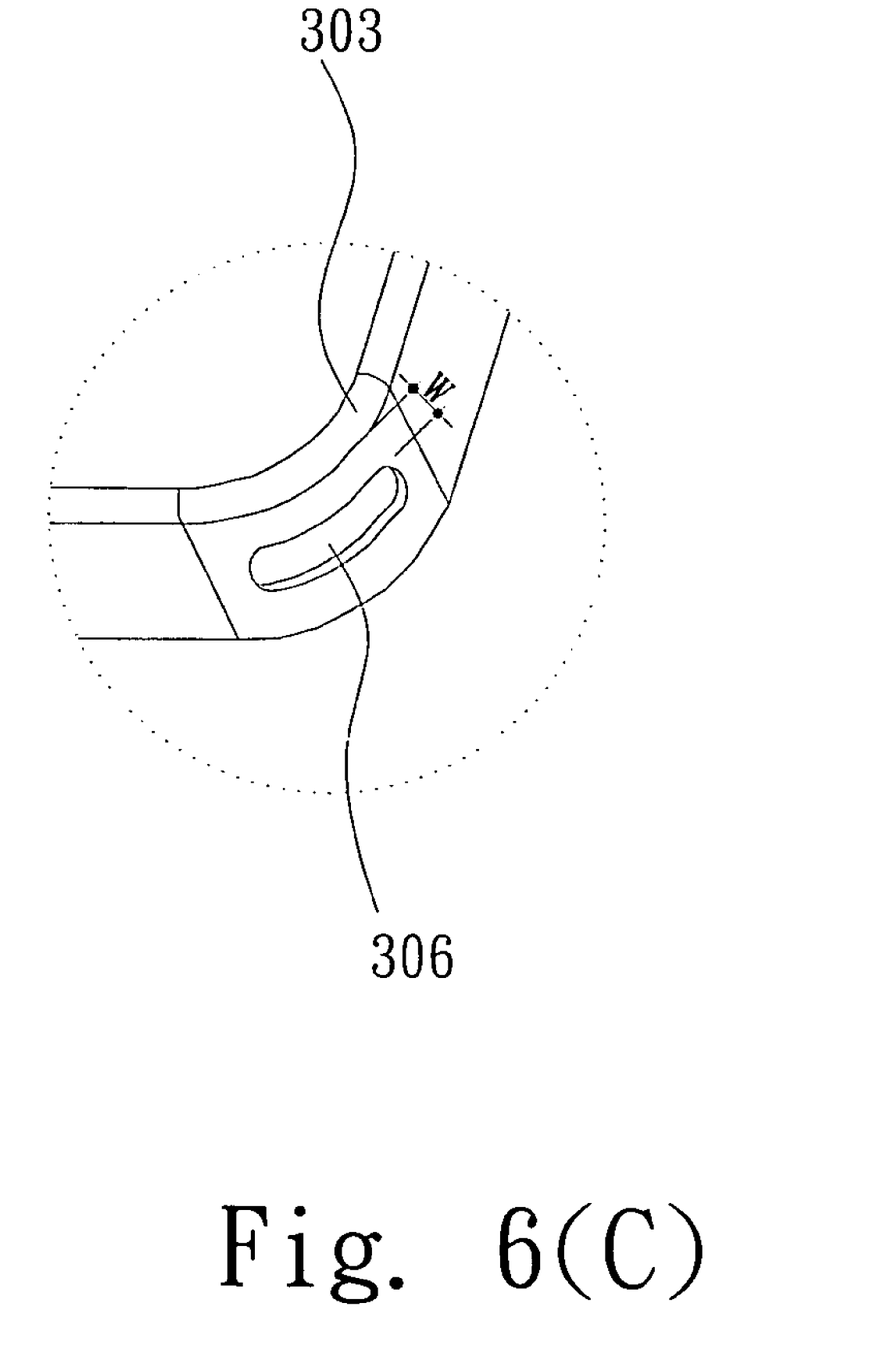
FIG. 6(C) is a partially enlarged view illustrating the corner portion of the metal cover in FIG. 6(B)

Several methods for fabricating improved metal covers are illustrated in the following examples. Referring to FIG. 6(A), a metal plate 300 including a central portion 301 and an edge portion 302 is provided. There is a vacant portion 306 between the corner 303 of the central portion 301 and the corresponding corner 304 of the edge portion 302. The vacant portion 306 is distant from the corner 303 of the central portion 301 by a distance W. After a draft operation is performed, a three-dimensional metal cover 30 as shown in FIG. 6(B) is formed. Please refer to FIG. 6(C). Since the vacant portion 306 has sufficient space to sustain the stress caused during the draft operation, the problems of resulting in cracks may be overcome. When the metal cover 30 is combined with a plastic frame (not shown) by using for example an insert molding operation or an ultrasonic welding operation, the vacant portions 306 may function as the bonding regions along with the holes 303 in the edge portion 302.

Figure 7A:
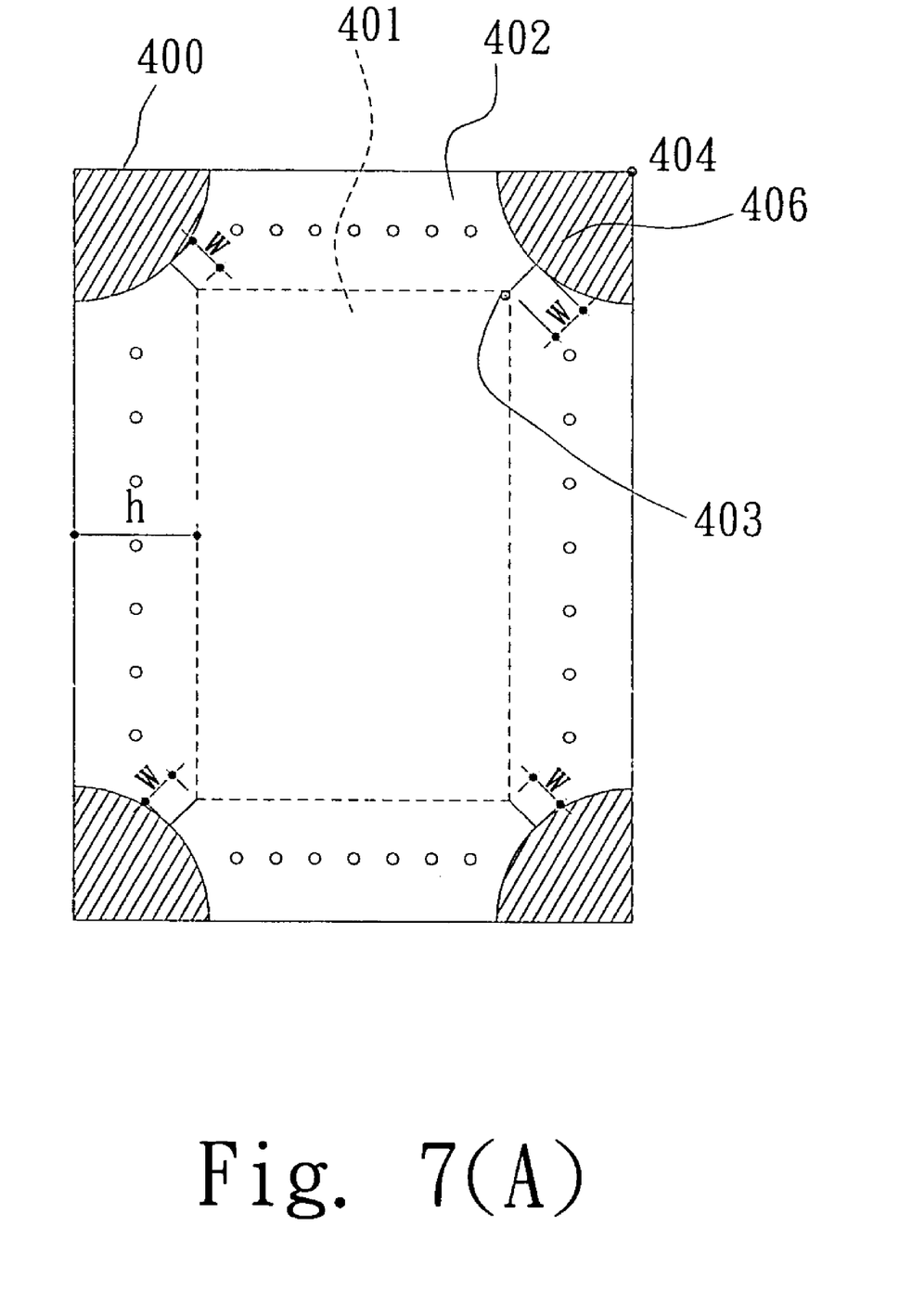
FIGS. 7(A) and 7(B) are schematic views illustrating a process for fabricating a three-dimensional metal cover used in an electronic card according to a fourth embodiment of the present invention.
Figure 7B:
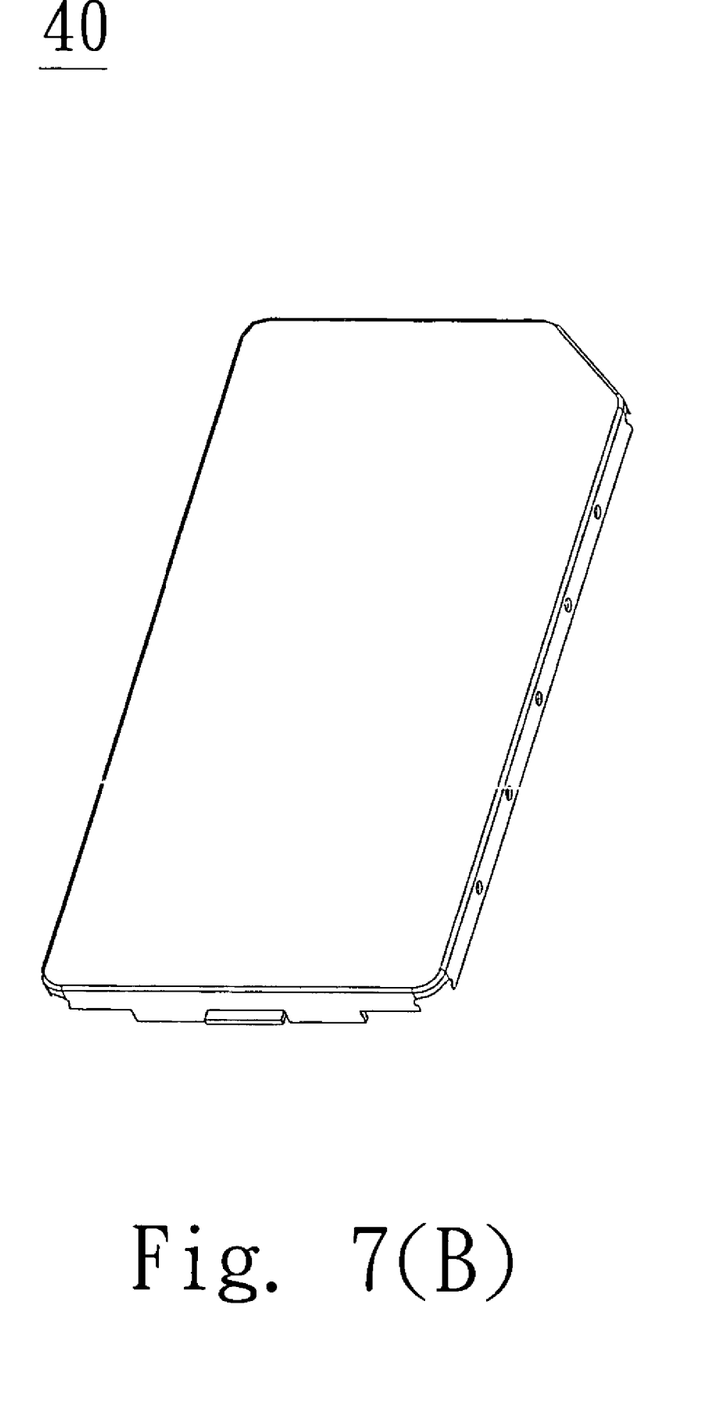
Figure 7C:
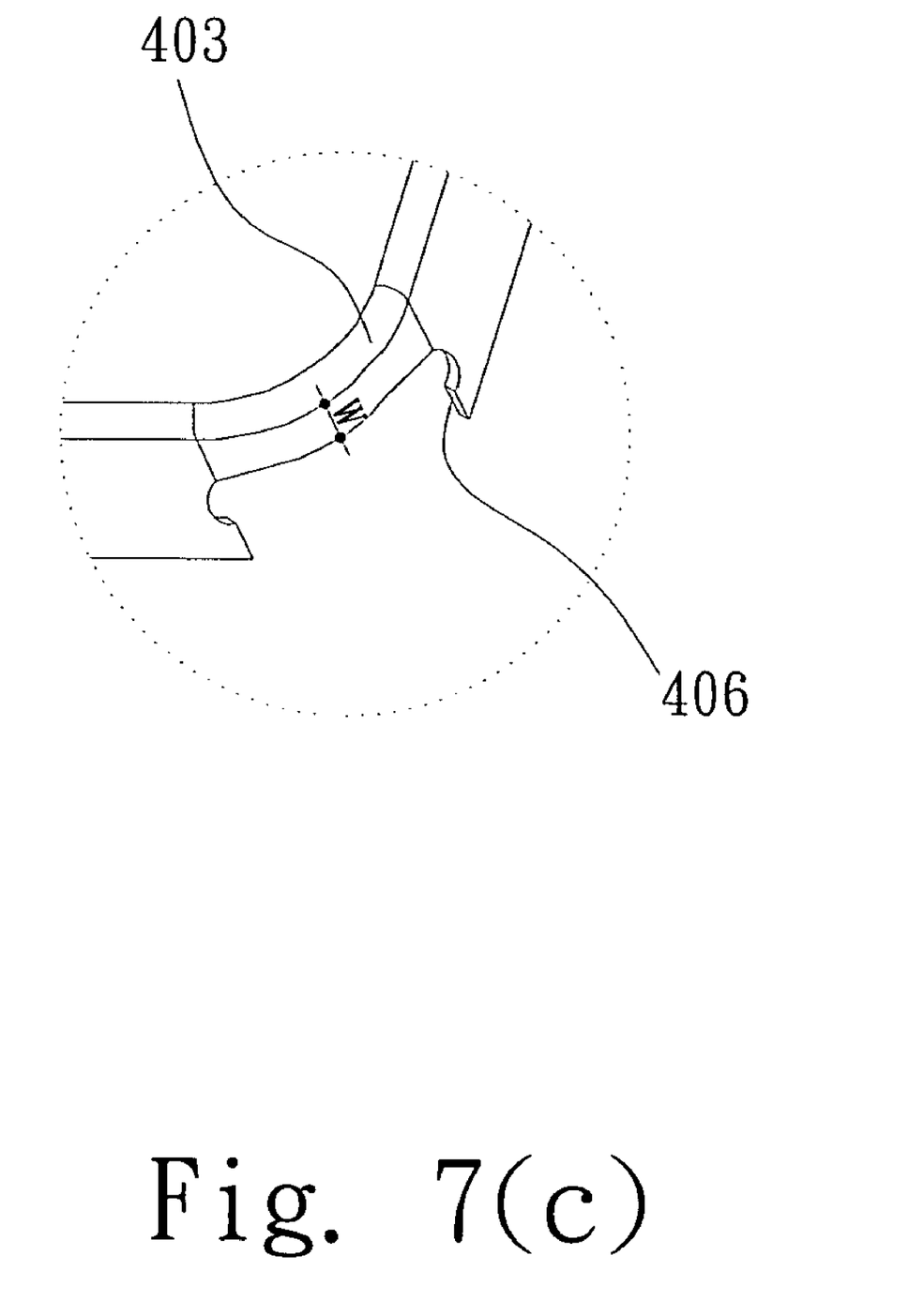
FIG. 7(C) is a partially enlarged view illustrating the corner portion of the metal cover in FIG. 7(B)

Referring to FIG. 7(A), a metal plate 400 including a central portion 401 and an edge portion 402 is provided. There is a vacant portion 406 distant from the corner 403 of the central portion 401 by a distance W. By cutting approximately one-fourth circle from the corner 404 of the edge portion 402, the vacant portion 406 is formed. After a draft operation is performed, a three-dimensional metal cover 40 as shown in FIG. 7(B) is formed. Please refer to FIG. 7(C). Likewise, since the vacant portion 406 has sufficient space to sustain the stress caused during the draft operation, the problems of resulting in cracks may be overcome.

Figure 8A:
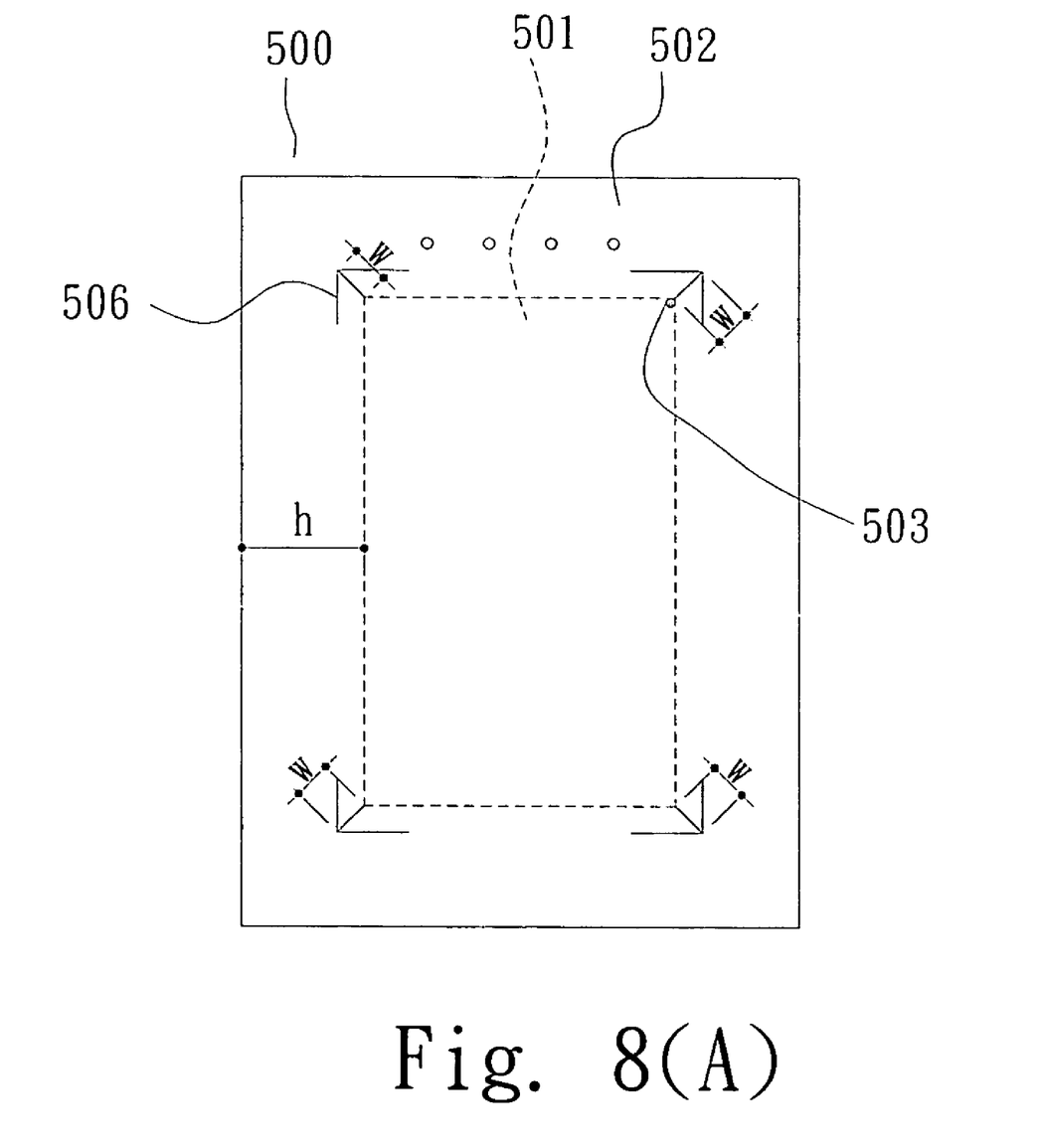
FIGS. 8(A) and 8(B) are schematic views illustrating a process for fabricating a three-dimensional metal cover used in an electronic card according to a fifth embodiment of the present invention.
Figure 8B:
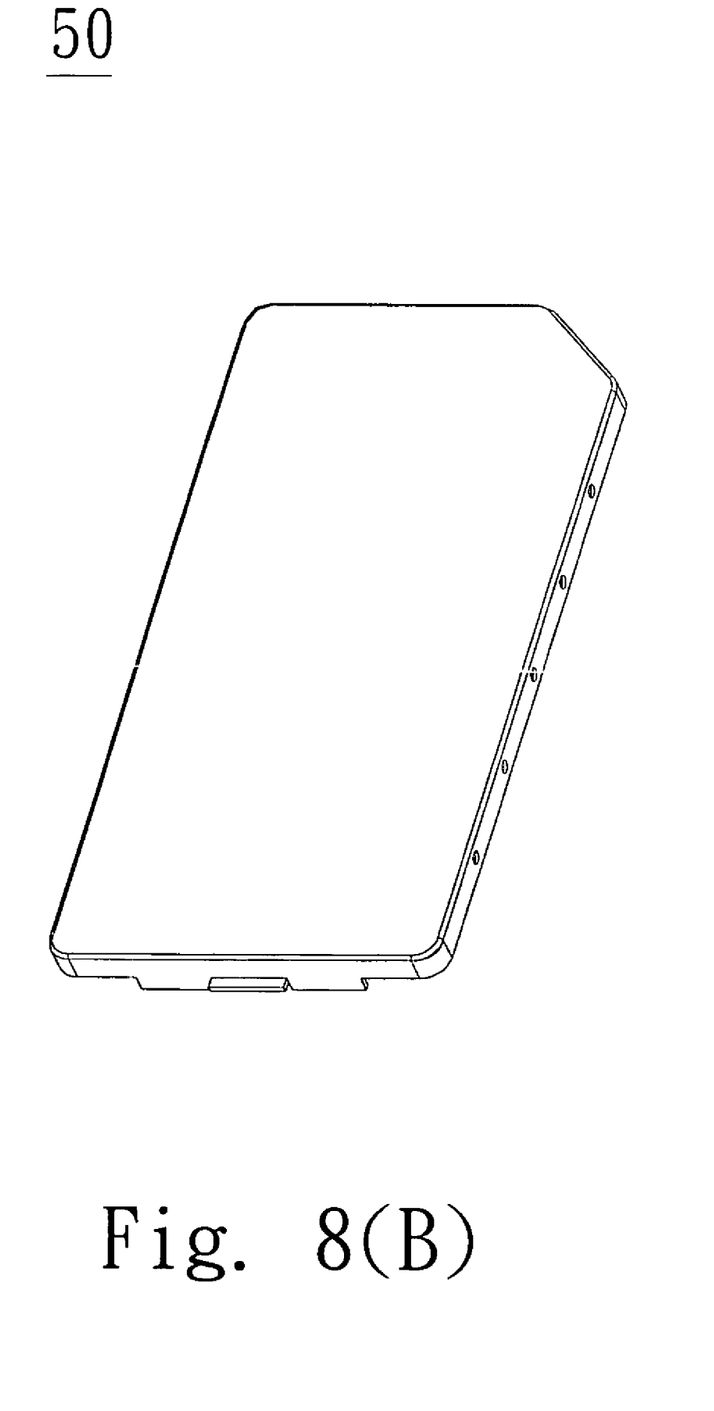
Figure 8C:
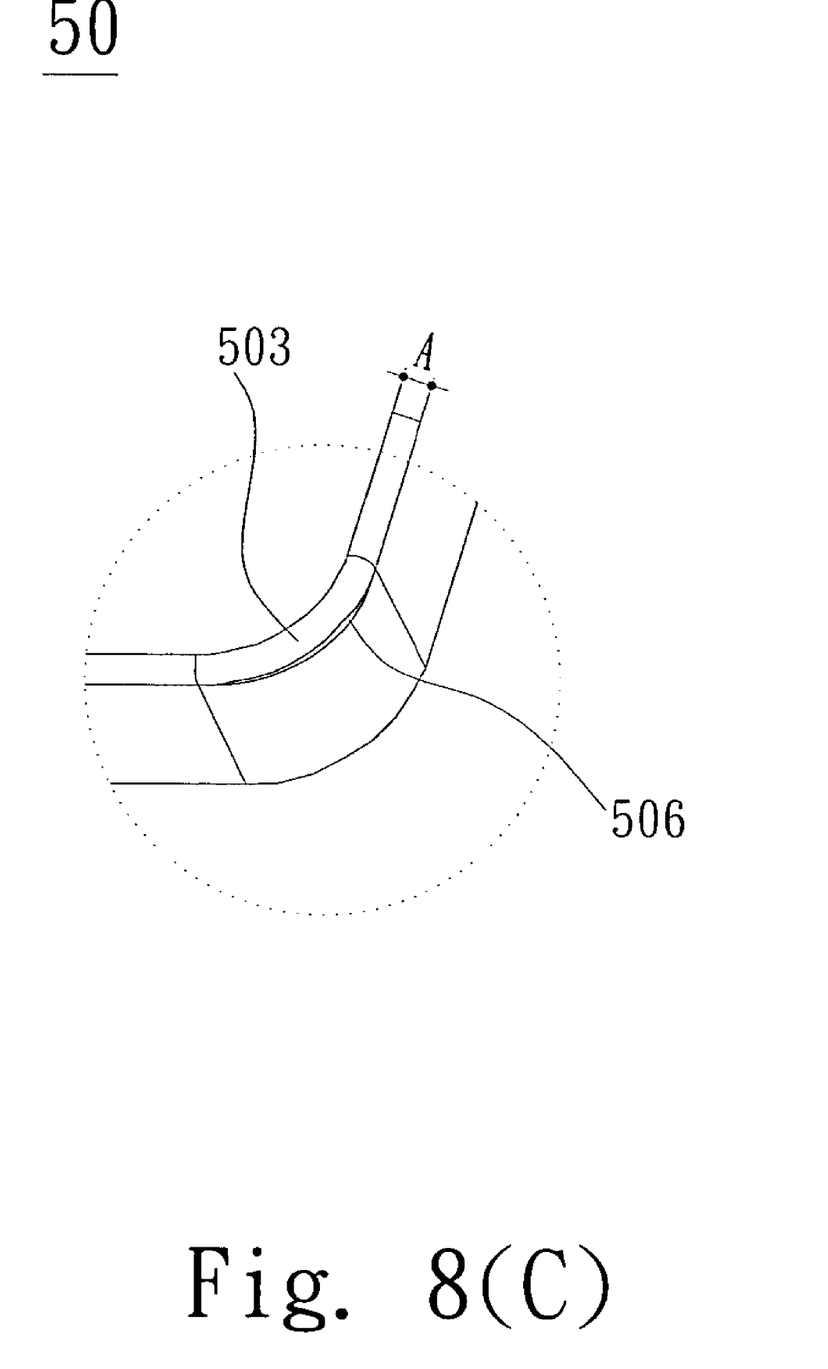
FIG. 8(C) is a partially enlarged view illustrating the corner portion of the metal cover in FIG. 8(B).

Referring to FIG. 8(A), a metal plate 500 including a central portion 501 and an edge portion 502 is provided. There is a cutting line 506 separated from the corner 503 of the central portion 501 by a predetermined distance W. After a draft operation is performed, a three-dimensional metal cover 50 as shown in FIG. 8(B) is formed. Please refer to FIG. 8(C). Likewise, since the cutting line 506 offers a little space as a vacant portion to sustain the stress caused during the draft operation, the problems of resulting in cracks may be overcome.

From the above description, the packaging structure of the electronic card provided by the present invention has increased adhesion because the metal cover has several bonding regions to enhance combination with the plastic frame and produced by a draft operation. The vacant portions or the cutting lines at the corner portions of the metal cover can function as additional bonding portions and avoid generation of cracks. In addition, the packaging structure of the electronic card can achieve electrostatic discharge (ESD) protection because the ground element is included.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A packaging structure of an electronic card, comprising:
   a metal cover, which is produced by providing a metal plate having a central portion and an edge portion and performing a draft operation on said metal plate such that said edge portion is vertical to said central portion;
   a plastic frame having a first surface combined with said metal cover;
   a printed circuit board combined with a second surface of said plastic frame; and
   at least a bonding region disposed in said edge portion for facilitating bonding when said metal cover is combined with said plastic frame, wherein said bonding region further comprises a vacant portion along a diagonal line between a first corner of said central portion and a second corner of said edge portion and separated from said first corner by a predetermined distance.

2. The packaging structure according to claim 1 wherein said bonding region includes a plurality of holes previously formed in said edge portion.

3. The packaging structure according to claim 1 wherein said first surface of said plastic frame is combined with said metal cover by a first embedding operation.

4. The packaging structure according to claim 3 wherein said first embedding operation comprises an insert molding operation, a fastening operation, an ultrasonic welding operation or a high frequency welding operation.

5. The packaging structure according to claim 1 wherein said second surface of said plastic frame is combined with said printed circuit board by a second embedding operation.

6. The packaging structure according to claim 5 wherein said second embedding operation comprises an insert molding operation, a fastening operation, an ultrasonic welding operation or a high frequency welding operation.

7. The packaging structure according to claim 1 wherein said metal cover further comprises a recess on an external surface thereof for facilitating removing said packaging structure.

8. The packaging structure according to claim 1 wherein said printed circuit board further comprises first and second contact pads, and said plastic frame further comprises first and second openings corresponding to said first and second contact pads.

9. The packaging structure according to claim 8 further comprising a ground element having first and second ends penetrating said first and second openings to be coupled with said first and second contact pads of said printed circuit board, and an upper portion electrically connected to an inner surface of said metal cover so as to form an electrostatic discharging path from said printed circuit board, said ground element and said metal cover.

10. The packaging structure according to claim 8 wherein said ground element is a metallic resilience sheet.

11. The packaging structure according to claim 1 wherein said electronic card is a secure digital card (SD card), a multimedia memory card (MMC card), a portable disc, an intelligent memory card, a modem card, a Local Area Network card (LAN card) or a memory card.

12. A packaging structure of an electronic card, comprising:
    a metal cover, which is produced by providing a metal plate having a central portion and an edge portion and performing a draft operation on said metal plate such that said edge portion is vertical to said central portion;
    a plastic frame having and a first surface combined with said metal cover;
    at least a bonding region with a vacant portion along a diagonal line between a first corner of said central portion and a second corner of said edge portion and separated from said first corner by a predetermined distance to facilitate the bonding effect when said metal cover is combined with said plastic frame;
    a printed circuit board combined with a second surface of said plastic frame; and
    a ground element electrically connected with said metal cover and said printed circuit board.

13. The packaging structure according to claim 12 wherein said bonding region includes a plurality of holes previously formed in said edge portion.

14. The packaging structure according to claim 12 wherein said printed circuit board comprises first and second contact pads, said plastic frame comprises first and second openings corresponding to said first and second contact pads, and said ground element has first and second ends penetrating said first and second openings to be coupled with said first and second contact pads and an upper portion electrically connected to an inner surface of said metal cover so as to form an electrostatic discharging path from said printed circuit board, said ground element and said metal cover.

15. The packaging structure according to claim 12 wherein said ground element is a metallic resilience sheet.

* * * * *